United States Patent
Doyle et al.

(10) Patent No.: US 7,449,373 B2
(45) Date of Patent: Nov. 11, 2008

(54) METHOD OF ION IMPLANTING FOR TRI-GATE DEVICES

(75) Inventors: Brian S. Doyle, Portland, OR (US); Suman Datta, Beaverton, OR (US); Jack T. Kavalieros, Portland, OR (US); Amlan Majumdar, White Plains, NY (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 11/394,614

(22) Filed: Mar. 31, 2006

(65) Prior Publication Data

US 2007/0238273 A1   Oct. 11, 2007

(51) Int. Cl.
  *H01L 21/00* (2006.01)
(52) U.S. Cl. ............... 438/149; 257/E27.112; 257/E29.275; 257/E21.618; 257/E21.633
(58) Field of Classification Search ........ 438/149, 438/157, 197, 230, 231, 232, 302, 527, 142, 438/202; 257/412, E21.345, E21.442, E27.112, 257/E29.275, E21.618, E21.633
See application file for complete search history.

(56) References Cited

U.S. PATENT DOCUMENTS

| | | |
|---|---|---|
| 4,906,589 A | 3/1990 | Chao |
| 4,996,574 A | 2/1991 | Shirasaki et al. |
| 5,124,777 A | 6/1992 | Lee et al. |
| 5,338,959 A | 8/1994 | Kim et al. |
| 5,346,839 A | 9/1994 | Sundaresan |
| 5,391,506 A | 2/1995 | Tada et al. |
| 5,466,621 A | 11/1995 | Hisamoto et al. |
| 5,521,859 A | 5/1996 | Ema et al. |
| 5,543,351 A | 8/1996 | Hirai et al. |
| 5,545,586 A | 8/1996 | Koh |
| 5,563,077 A | 10/1996 | Ha et al. |
| 5,578,513 A | 11/1996 | Maegawa |
| 5,658,806 A | 8/1997 | Lin et al. |
| 5,701,016 A | 12/1997 | Burroughs et al. |
| 5,716,879 A | 2/1998 | Choi et al. |
| 5,739,544 A | 4/1998 | Yuki et al. |
| 5,804,848 A | 9/1998 | Mukai |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,888,309 A | 3/1999 | Yu |
| 5,899,710 A | 5/1999 | Mukai |

(Continued)

FOREIGN PATENT DOCUMENTS

EP   0 623963 A1   11/1994

(Continued)

OTHER PUBLICATIONS

International Search Report PCT/US03/26242.

(Continued)

*Primary Examiner*—Brook Kebede
(74) *Attorney, Agent, or Firm*—Blakely, Sokoloff, Taylor & Zafman LLP

(57) ABSTRACT

A method for ion implanting a tip source and drain region and halo region for a tri-gate field-effect transistor is described. A silicon body is implanted, in one embodiment, from six different angles to obtain ideal regions.

19 Claims, 3 Drawing Sheets

U.S. PATENT DOCUMENTS

| | | | |
|---|---|---|---|
| 5,905,285 A | 5/1999 | Gardner et al. | |
| 6,018,176 A | 1/2000 | Lim | |
| 6,020,244 A | 2/2000 | Thompson et al. | |
| 6,066,869 A | 5/2000 | Noble et al. | |
| 6,163,053 A | 12/2000 | Kawashima | |
| 6,252,284 B1 | 6/2001 | Muller et al. | |
| 6,376,317 B1 | 4/2002 | Forbes et al. | |
| 6,391,782 B1 | 5/2002 | Yu | |
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,459,123 B1 | 10/2002 | Enders et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,583,469 B1 | 6/2003 | Fried et al. | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,645,797 B1 | 11/2003 | Buynoski et al. | |
| 6,657,259 B2 | 12/2003 | Fried et al. | |
| 6,680,240 B1 | 1/2004 | Maszara | |
| 6,689,650 B2 | 2/2004 | Gambino et al. | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,690 B1 * | 4/2004 | Wang et al. | 438/197 |
| 6,730,964 B2 | 5/2004 | Horiuchi | |
| 6,756,657 B1 | 6/2004 | Zhang et al. | |
| 6,770,516 B2 | 8/2004 | Wu et al. | |
| 6,774,390 B2 | 8/2004 | Sugiyama et al. | |
| 6,787,402 B1 | 9/2004 | Yu | |
| 6,787,406 B1 * | 9/2004 | Hill et al. | 438/164 |
| 6,787,854 B1 | 9/2004 | Yang et al. | |
| 6,790,733 B1 | 9/2004 | Natzle et al. | |
| 6,794,313 B1 | 9/2004 | Chang | |
| 6,794,718 B2 | 9/2004 | Nowak et al. | |
| 6,798,000 B2 | 9/2004 | Luyken et al. | |
| 6,800,885 B1 | 10/2004 | An et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,815,277 B2 | 11/2004 | Fried et al. | |
| 6,821,834 B2 | 11/2004 | Ando | |
| 6,831,310 B1 * | 12/2004 | Mathew et al. | 257/270 |
| 6,833,588 B2 | 12/2004 | Yu et al. | |
| 6,835,614 B2 | 12/2004 | Hanafi et al. | |
| 6,835,618 B1 | 12/2004 | Dakshina-Murthy et al. | |
| 6,838,322 B2 | 1/2005 | Pham et al. | |
| 6,849,884 B2 | 2/2005 | Clark et al. | |
| 6,858,478 B2 | 2/2005 | Chau et al. | |
| 6,867,460 B1 | 3/2005 | Anderson et al. | |
| 6,869,868 B2 | 3/2005 | Chiu et al. | |
| 6,884,154 B2 | 4/2005 | Mizushima et al. | |
| 6,885,055 B2 | 4/2005 | Lee | |
| 6,897,527 B2 | 5/2005 | Dakshina-Murthy et al. | |
| 6,921,982 B2 | 7/2005 | Joshi et al. | |
| 6,974,738 B2 | 12/2005 | Hareland | |
| 6,867,433 B2 | 3/2006 | Yeo et al. | |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0042542 A1 | 3/2003 | Maegawa et al. | |
| 2003/0057486 A1 | 3/2003 | Gambino et al. | |
| 2003/0067017 A1 | 4/2003 | Ieong et al. | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0102518 A1 | 6/2003 | Fried et al. | |
| 2003/0111686 A1 | 6/2003 | Nowak | |
| 2003/0122197 A1 | 7/2003 | Hwang et al. | |
| 2003/0143791 A1 | 7/2003 | Cheong et al. | |
| 2003/0201458 A1 | 10/2003 | Clark et al. | |
| 2003/0203579 A1 | 10/2003 | Post et al. | |
| 2003/0227036 A1 | 12/2003 | Sugiyama et al. | |
| 2004/0031979 A1 | 2/2004 | Lochtefeld et al. | |
| 2004/0036126 A1 | 2/2004 | Chau et al. | |
| 2004/0036127 A1 | 2/2004 | Chau et al. | |
| 2004/0061178 A1 | 4/2004 | Lin-Ming-Ren et al. | |
| 2004/0061187 A1 | 4/2004 | Weber et al. | |
| 2004/0063262 A1 | 4/2004 | Feudel et al. | |
| 2004/0094807 A1 | 5/2004 | Chau et al. | |
| 2004/0099903 A1 | 5/2004 | Yeo et al. | |
| 2004/0119100 A1 | 6/2004 | Nowak et al. | |
| 2004/0166642 A1 | 8/2004 | Chen et al. | |
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0197975 A1 | 10/2004 | Krivokapic et al. | |
| 2004/0198003 A1 | 10/2004 | Yeo et al. | |
| 2004/0217433 A1 * | 11/2004 | Yeo et al. | 257/412 |
| 2004/0219780 A1 | 11/2004 | Ohuchi | |
| 2004/0227187 A1 | 11/2004 | Cheng et al. | |
| 2004/0238887 A1 | 12/2004 | Nihey | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2005/0017377 A1 | 1/2005 | Joshi et al. | |
| 2005/0035415 A1 | 2/2005 | Yeo et al. | |
| 2005/0093067 A1 | 5/2005 | Yeo et al. | |
| 2005/0093154 A1 | 5/2005 | Kottantharayil et al. | |
| 2005/0118790 A1 | 6/2005 | Lee et al. | |
| 2005/0127362 A1 | 6/2005 | Zhang et al. | |
| 2005/0145941 A1 | 7/2005 | Bedell et al. | |
| 2005/0156171 A1 | 7/2005 | Brask et al. | |
| 2005/0156202 A1 | 7/2005 | Rhee et al. | |
| 2005/0184316 A1 | 8/2005 | Kim et al. | |
| 2005/0191795 A1 | 9/2005 | Chidambarrao et al. | |
| 2005/0224797 A1 | 10/2005 | Ko et al. | |
| 2005/0224800 A1 | 10/2005 | Lindert | |
| 2005/0227498 A1 | 10/2005 | Furukawa et al. | |
| 2005/0230763 A1 | 10/2005 | Huang et al. | |
| 2006/0014338 A1 | 1/2006 | Doris et al. | |
| 2006/0068590 A1 | 3/2006 | Lindert et al. | |

FOREIGN PATENT DOCUMENTS

| | | |
|---|---|---|
| EP | 1 202 335 A2 | 5/2002 |
| EP | 1 566 844 A2 | 8/2005 |
| JP | 06177089 | 6/1994 |
| JP | 2003-298051 | 10/2003 |
| WO | WO 02/43151 A1 | 5/2002 |

OTHER PUBLICATIONS

International Search Report PCT/US03/39727.
International Search Report PCT/US03/40320.
International Search Report PCT/US2005/000947.
International Search Report PCT/US2005/010505.
International Search Report PCT/US2005/020339.
International Search Report PCT/US2005/033439.
International Search Report PCT/US2005/037169.
International Search Report PCT/US2004/032442.
International Search Report and Written Opinion PCT/US2006/000378.
International Search Report PCT/US2006/037643.

International Search Report and Written Opinion PCT/US2006/024516.

Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.

Jing Guo et al. "Performance Projections for Ballistic Carbon Nanotube Field-Effect Transistors" Applied Physics Letters, vol. 80, No. 17, Apr. 29, 2002, pp. 3192-2194.

Ali Javey et al., "High-K Dielectrics for Advanced Carbon-Nanotube Transistors and Logic Gates", Advance Online Publication, Published online, Nov. 17, 2002, pp. 1-6.

Richard Martel et al., "Carbon Nanotube Field Effect Transistors for Logic Applications" IBM, T.J. Watson Research Center, 2001 IEEE, IEDM 01, pp. 159-162.

David M. Fried et al., "Improved Independent Gate N-Type FinFET Fabrication and Characterization", IEEE Electron Device Letters, vol. 24, No. 9, Sep. 2003, pp. 592-594.

David M. Fried et al., "High-Performance P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices" vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs).

V. Subramanian et al. "A Bulk Si-Compatible Ultrathin-Body SOI Technology for Sub-100nm MOSFETS", Proceedings of the 57th Annual Device Reach Conference, (1999) pp. 28-29.

Hisamoto et al. "A Folded-Channel MOSFET for Deep-sub-tenth Micron Era", 1998 IEEE International Electron Device Meeting Technical Digest, (1998) pp. 1032-1034.

Huang et al., "Sub 50nm FinFet: PMOS", 1999 IEEE International Electron Device Meeting Technical Digets, (1999) pp. 67-70.

Auth et al., "Vertical, Fully-Depleted, Surroundings Gate MOSFETS on Sub 0.1um Thick Silicon Pillars", 1996 54th Annual Device Reseach Conference Digest, (1996) pp. 108-109.

Hisamoto et al., "A Fully Depleted Lean-Channel Transistor (DELTA)—A Novel Vertical Ultrathin SOI MOSFET", IEEE Electron Device Letters, vol. 11 No. 1, (1990) pp. 36-38.

Digh Hisamoto et al., "FinFet—A Self Aligned Double-Gate MOSFET Scalable to 20nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Triple Gate FinFets", IEEE 2003, pp. 135-138.

S.T. Chang et al., "3-D Simulation of Strained Si/SiGe Heterojunction FinFETs", pp. 176-177.

B. Jin et al., "Mobility Enhancement in Compressively Strained SiGe Surface Channel PMOS Transistors with HfO2/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs).

Ludwig, T. et al., "FinFET Technology for Future Microprocessors" 2003 IEEE, pp. 33-34.

Stolk, Peter A. et al. "Modeling Statistical Dopant Fluctuations in MOS Transistors", 1998 IEEE, IEEE Transactions on Electron Devices, vol. 45, No. 9, Sep. 19987, pp. 1960-1971.

Seevinck, Evert et al., "Static-Noise Margin Analysis of MOS SRAM Cells" 1987 IEEE, IEEE Journals of Solid-State Circuits, vol. SC-22, No. 5, Oct. 1987.

Ieong, M. et al. "Three Dimensional CMOS Devices and Integrated Circuits", IEEE 2003, CICC, San Jose, CA, Sep. 21-24, 2003, pp. 207-214.

Nowak, E. J. et al., "Scaling Beyond the 65nm Node with FinFET-DGCMOS", IEEE 2003, CICC, San Jose, CA, Sep. 21-24, 2003, pp. 339-342.

Jones, E.C., "Doping Challenges in Exploratory Devices for High Performance Logic", 14th International Conference, Piscataway, NJ, Sep. 22-27, 2002, pp. 1-6.

Park, T. et al. "PMOS Body-Tied FinFET (Omega MOSFET) Characteristics", Device Research Conference, Piscataway, NJ, Jun. 23-25, 2003, IEEE, pp. 33-34.

Nowak, E.J. et al., "A Functional FinFET-DGCMOS SRAM Cell", International Electron Devices Meeting 2002, San Francisco, CA, Dec. 8-11, 2002, pp. 411-414.

Jong-Tae Park et al., "Pi-Gate SOI MOSFET" IEEE Electron Device Letters, vol. 22, No. 8, Aug. 2001, pp. 405-406.

Yang-Kyu Choi et al. "Sub-20nm CMOS FinFET Technologies", IEEE 2001, IEDM 01-421 to 01-424.

Datta, et al., "A Dual Halo Implant for Improving Short Channel Effect in Three-Dimensional Tri-Gate Transistors," U.S. Appl. No. 11/321,128, filed Dec. 28, 2005.

* cited by examiner

METHOD OF ION IMPLANTING FOR TRI-GATE DEVICES

FIELD OF THE INVENTION

The invention relates to tip and halo implants in field-effect devices.

PRIOR ART AND RELATED ART

It is well known to implant the source and drain regions of field-effect transistors with a shallow, extension source and drain regions to, for example, reduce punchthrough. It is also well known to implant doping under the gates of field-effect transistors, generally after the formation of the shallow, extension source and drain regions and before the formation of side spacers. This implantation is used to form doped halos, in some applications, to adjust the threshold voltage and to combat short channel effects. This implantation may provide compensation for variations in critical dimensions of the gate. See for instance U.S. Pat. No. 6,020,244 and U.S. Publication 2004/0061187.

Sometimes dual halo implants are used to provide dual thresholds for both NMOS and PMOS transistors. Examples of this are shown in U.S. Publications 2003/0203579 and 2003/0122197. In other cases, particularly for tri-gate devices, dual implants are used at different angles to assure the implantation of halos, both for the top transistor and sidewall transistors. See "A Dual Halo Implant for Improved Short Channel Effect in 3-Dimensional Tri-Gate Transistors," U.S. Ser. No. 11/321,128, filed Dec. 28, 2005, assigned to the assignee of the present application.

DETAILED DESCRIPTION

A method for providing tip source/drain and halo implants particularly suited for a tri-gate transistor is described. In the following description, numerous specific details are set forth such as dose levels, in order to provide a thorough understanding of the present invention. It will be apparent to one skilled in the art, that the present invention may be practiced without these specific details. In other instances, well-known processes needed to carry out ion implantation, such as dopant activation, are not described in detail in order to not unnecessarily obscure the present invention.

There are numerous performance advantages to tri-gate transistors which justifies the increased complexity needed in their fabrication. Among the fabrication challenges is the difficulty of optimizing the tip and halo implantation profiles in this three-dimensional structure.

As an example, currently, multiple energy implants are proposed to target the shallow and deep portions of the device source/drain regions and channel regions. In the case of the tip implant of the body or fin, implanting vertically dopes the top of the fin. This vertical implant does not effectively implant the sidewalls which may have a 50 nm or deeper depth. Deep and shallow implants can be used. The consequences of the deep implants include a resultant spread or lateral "straggle" which severely limits the precision with which the dopant can be introduced and creating devices with different effective lengths.

Another difficulty stems from the fact that a first type dopant is needed for the tip implant and a second type dopant is needed for the halo implant. Consequently, the introduction of the halo dopant can counter-dope the tip region.

Tri-gate transistors may be looked at as constituting a top transistor, similar to a conventional planar transistor, and two side wall transistors. Usually, a single angled halo implant is used from opposite directions to, for instance, adjust the threshold voltage of the transistors and to control the short channel effects. If this implantation is targeted deep (nearly vertical) in order to control the side transistors and lower plane of the tri-gate transistor, which is most susceptible to short channel effect, the threshold voltage of the top transistor is too low. On the other hand, if the halo implant is at a shallow angle and relatively low energy, the bottom of the transistor is lightly doped, making the transistor susceptible to subsurface punchthrough (e.g. source to drain tunneling). Moreover, the source/drain extension regions are counter doped, leading to a high external resistance.

In the description which follows, ion implantation occurs at different angles relative to the devices being fabricated. Some conventions are needed in this patent to explain the angles at which the implantation occurs.

Figure 1:
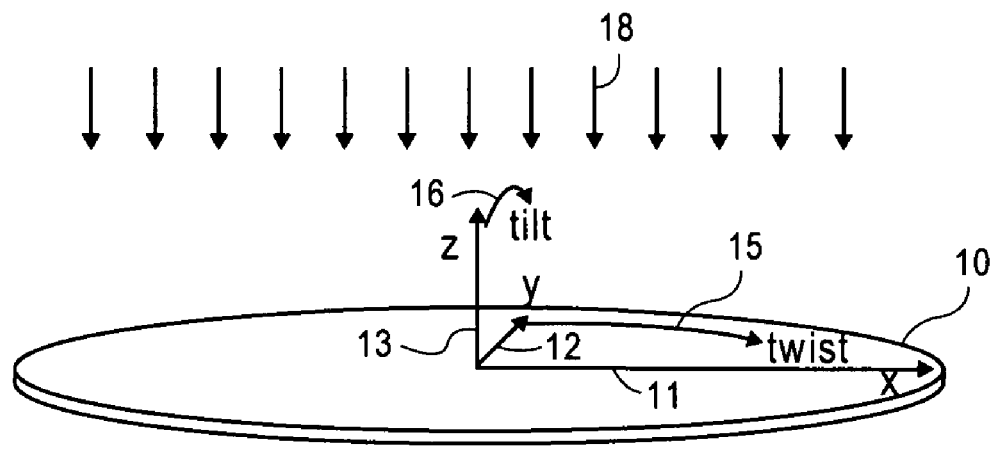
FIG. 1 illustrates a wafer being ion implanted. This figure is used to show tilt and twist angles.

In FIG. 1, a wafer 10 is illustrated being ion implanted as shown by the ion beam 18. Typically in an ion implanter the beam is fixed relative to the implanter. The wafer is mounted on a movable platform and can be moved to desired angles for implantation. In FIG. 1, the wafer is shown on an X-axis 11 and Y-axis 12, both of which are in the plane of the wafer. The wafer 10 is also shown to have a Z-axis 13 normal to the plane of the wafer. For the discussion below, "twist" refers to rotation of the wafer (or a substrate) in the plane of the wafer as indicated by the arrow 15. "Tilt" refers to tilting the wafer in any direction as indicated by arrow 16 in the YZ plane. With a combination of twisting and tilting, ions can be implanted at any desired angle into devices fabricated on the wafer 10.

Figure 2:
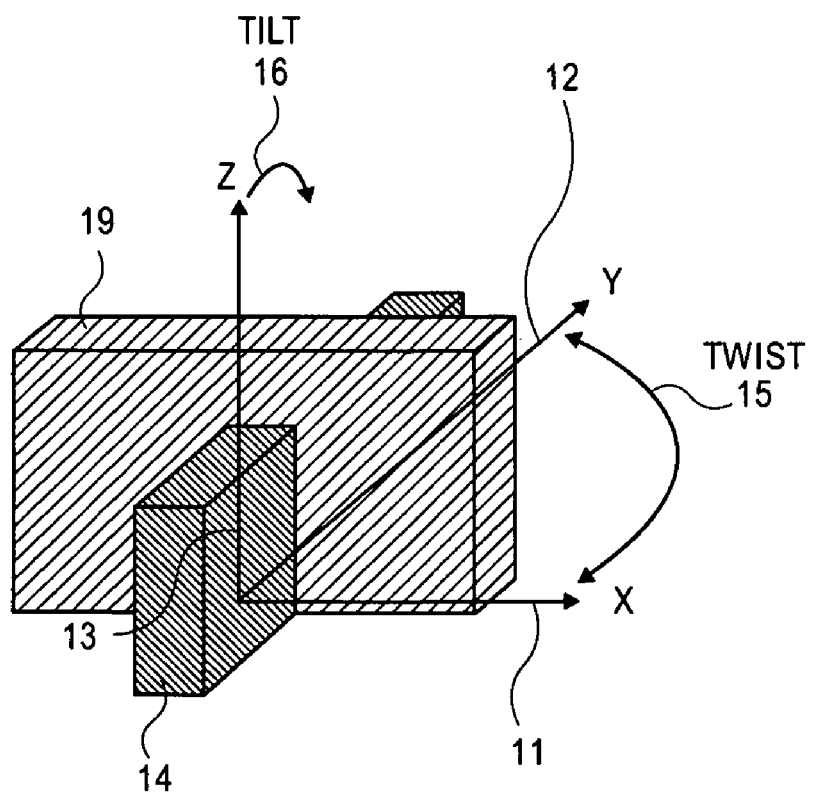
FIG. 2 is a perspective view of a semiconductor body or fin and a tri-gate structure. This figure is used to show the axes orientation adopted for purposes of explanation in this patent.

In FIG. 2, a single semiconductor fin 14 is illustrated with a transverse gate structure 19. The fin 14 may be formed on a bulk silicon substrate by masking some regions and then epitaxially growing fins on the exposed silicon. Alternatively, the fin may be etched in a bulk silicon. Moreover, a silicon-on-insulator (SOI) substrate may be used where the fins are etched in a thin monocrystalline film. For purposes of explanation in this patent, it is assumed that the fin 14 is disposed along the Y-axis 12, the gate structure 19 is disposed along the X-axis 11, and that the fin 14 extends upward along the Z-axis 13.

The structure of FIG. 2 may be disposed on the wafer 10 of FIG. 1. The twisting and tilting that occurs in an ion implanter is shown as twist 15 and tilt 16 in FIG. 2. Consequently, by way of example, the fin 15 may be twisted in the XY plane so that the fin is at acute angle to the Y-axis, and then it may be tilted, as shown by the arrow 16 in FIG. 2. For the description below, it is assumed that the tilting occurs in only a single plane. This is often the case since the table upon which the wafer is mounted is effectively hinged for the described embodiment, along the X-axis.

It will be apparent to one skilled in the art that the orientation of the fin 14 along the axes shown in FIG. 2 is arbitrary. The fin 14 could just as well extend along the X-axis, and the gate structure 19 along the Y-axis. If this is the case, the twisting and tilting, described below, will need to be adjusted to accommodate this different orientation of the fin 14. Additionally, if for instance, the table on which the wafer is mounted tilts in all directions, as it would if it is gimbled, then the twisting described below determines the plane in which the tilting occurs.

Figure 3:
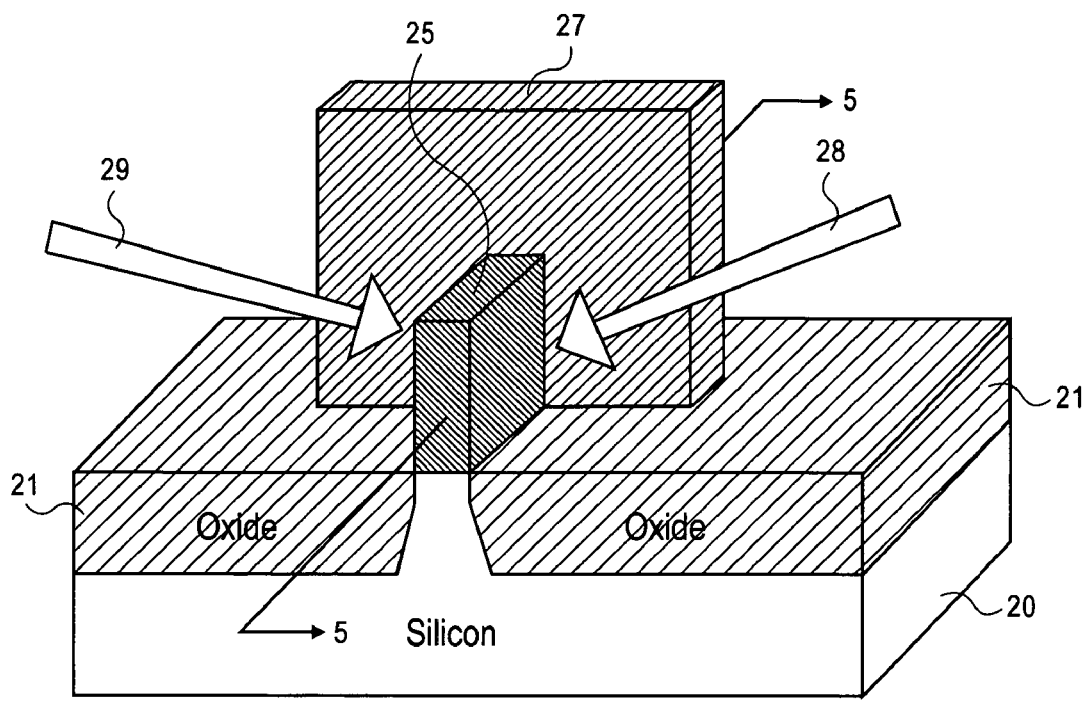
FIG. 3 is a perspective view of a tri-gate transistor during its fabrication and more particularly during an implantation step used to implant the tip source and drain regions.
Figure 4:
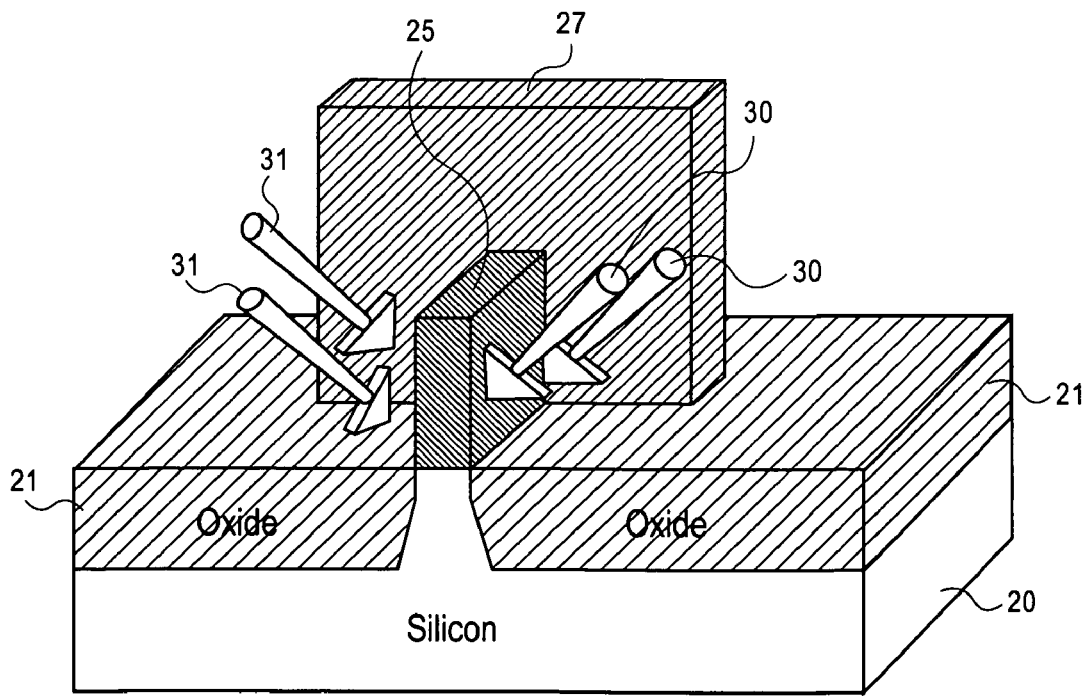
FIG. 4 illustrates the structure of FIG. 3 in another ion implantation process, for implanting halo regions.
Figure 5:
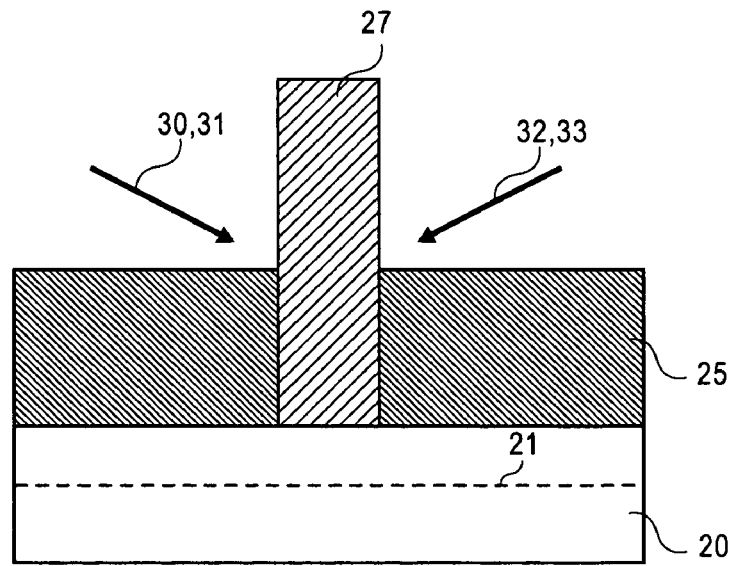
FIG. 5 illustrates the structure of FIG. 3 in a cross-sectional view, taken generally through the sectional line 5-5 of FIG. 3.

In FIGS. 3, 4 and 5 below, ion implantation is shown occurring into a semiconductor body or fin 25. Rather than showing a wafer or substrate, twisted and turned, a substrate is shown in a normal position and the ion beam at an angle. The angle of the beam is described by the twisting and tilting discussed above relative to the X, Y and Z-axes shown in FIG. 2.

In FIG. 3, a monocrystalline silicon substrate 20, which is a portion of the wafer 10 of FIG. 1, is illustrated. A monocrystalline silicon body or fin 25 is formed on the substrate 20. Where a bulk substrate 20 is used, the fin 25 can be formed by epitaxial growth between the oxide members 21. The fin 25 may also be formed by etching a substrate leaving a fin in place. The fin 25 may also be formed on a silicon-oxide-insulator (SOI) substrate, as mentioned.

A tri-gate structure 27 is formed on at least three sides of the fin 25 as part of, for instance, a replacement gate process. At the point in processing shown in FIGS. 3-5, the structure 27 may be a dummy gate, of for instance, polysilicon, which is subsequently removed and replaced with a high-k dielectric and a metal gate with a targeted work function.

The relationship of the gate structure 27 of FIG. 3 and the fin 25 is illustrated in FIG. 5, a cross-sectional, elevation view taken through the section line 5-5 of FIG. 3. In this view, it can be seen that the gate structure 27 wraps around the fin 25. When a field-effect transistor is fabricated from the structure of FIGS. 3-5, the source and drain regions are formed in the portion of the fin 25 not covered by the gate structure 27. The portion of the fin 25 covered by the gate structure 27 becomes the channel region of the transistor. It is the channel region which receives the halo implant, and the exposed portions of the fin 25 which receive the tip implant.

In one embodiment, both the tip implant and halo implant are done at the stage in transistor fabrication shown in FIGS. 3-5. After these implants, spacers are formed on the sides of the gate structure 27. Then, the main source and drain regions are implanted in alignment with the spacer. Following this, a dielectric such as an interlayer dielectric (ILD) is formed surrounding the gate structure 27. This allows the gate structure 27 to be etched, leaving exposed, the channel region of the fin 25. Then, the final high-k dielectric and metal gate are formed in the replacement gate process. Other embodiments, where, for instance, the spacers are formed after the halo implant are discussed later.

The tip implant for the lightly doped source and drain regions is done with the ion beam being generally parallel to the sides of the gate structure 27 and at an acute angle to a normal extending from the XY plane. This angle is obtained by twisting the wafer ±90° and then tilting the wafer to the acute angle. The ion implantation that occurs with the twist of +90° and the tilt of the acute angle is shown by beam 28 in FIG. 3. The implantation that occurs with the twist of −90° and a tilt to the acute angle is shown by beam 29 in FIG. 3.

At first it may seem that a tilt of 45° is ideal. The problem that occurs, however, is that if 45° is selected, the top surface of the fin 25 receives twice the dose since it is implanted first by the beam 28 at the +90° angle, and then again by the beam 29 in the −90° angle. Thus, the top receives more dopant than the sides.

An acute angle of 60° ensures that both the top and sides get the same dopant concentration. However, this results in a shallower doping of the top since the angle of incident for the top surface is 60°, whereas the angle of incident for the sides of the fin is 30°.

An angle of between 50°-55° tilt has been found to provide the best trade-off between the depth of the implant and the concentration of the implant. As will be shown later, in conjunction with FIG. 6, implanting in this manner provides a better than 30% increase in performance, when compared to a vertical implant into the fin 25.

The dopant for the tip implant is of an opposite conductivity type to the halo implant. The tip implant may be phosphorous or arsenic for an n-channel transistor, or boron for a p-channel transistor. A typical implant dose may be 5E14-5E15 atoms/cm$^2$. In some processes, it may be possible to implant the fin with a single ion implantation step from a single side of the fin (i.e. either + or −90°). An angle between 45°-60° is used in one embodiment.

FIG. 4 illustrates the halo implant. For the n-channel transistor, a p-type dopant such as boron is used. For a p-channel transistor, an n-type dopant such as phosphorous or arsenic is used. As mentioned earlier, it is necessary to get the dopant along both the sides and top of the fin 25 under the gate structure 27. This assures that both the top and the side "transistors" formed by the tri-gate, turn-on at the same time.

The halo implant is done in four steps. Two implantations are done from one side of the gate structure 27 as shown by beams 30 and 31 of FIG. 4. Two other implants are done from the other side of the gate structure as best seen in FIG. 5, as shown by the beam 32 and 33. The first two implants are done by first twisting the wafer by a 180° and then implanting at an additional twist ± a first acute angle ($\theta_1$) from the 180° twist with a tilt of a second acute angle ($\theta_2$). The third and fourth implants are done at ±$\theta_1$. That is, the fin is twisted ±$\theta_1$ from the position shown in FIG. 2. Again, a tilt angle of $\theta_2$ is used for the third and fourth implants. $\theta_1$ of 10°-45° with a tilt ($\theta_2$) of, again, 50°-55° is used. In a typical field-effect transistor a dose of 1E12-1E13 atoms/cm$^2$ may be typical. The selection of $\theta_2$ is, for the most part, based on the same rational used for the selection of the tilt angle for the tip implant.

While in the above description the tip implants are performed before the halo implants, the halo implants may be performed before the tip implants. A number of other alternate orders of the steps may be used. First, it should be appreciated that since the tip implant is done at an angle, it may be done after the spacers are formed. Thus, the halo implants may be done first (without spacers) followed by forming the spacers, and then the tip implants. Alternatively, the tip implants may be first, followed by forming spacers, and then the halo implants.

Figure 6:
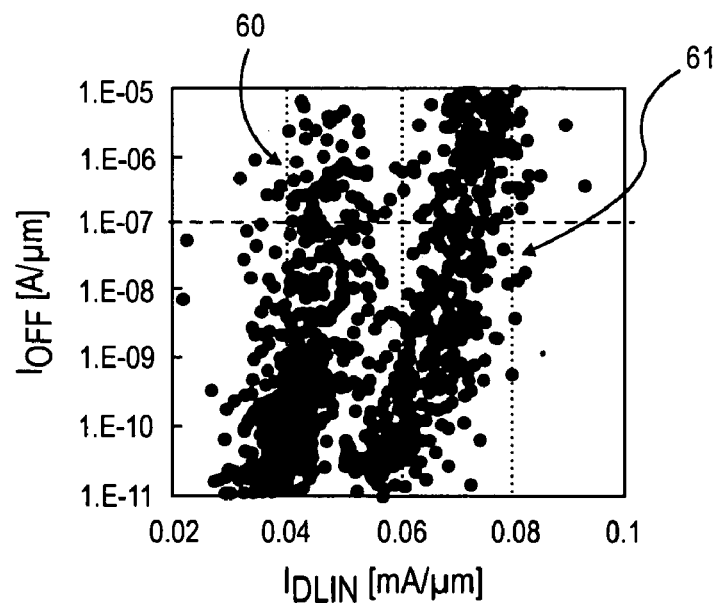
FIG. 6 is a graph illustrating the improved performance obtained for the angled tip implant over a vertical implant.

In FIG. 6, the data point group 60 represents one measure of performance for vertical implantation, whereas the group 61 shows the performance for the tip implants at the tilt angle of 50°-55°, as described earlier. As can be seen, the ratio of the off current to the current before saturation is much improved by the angled implant, as shown by the grouping 61. There is an approximately 30% increase in performance, as mentioned earlier.

Thus, with angled implants as described above, better performance is achieved, as well as improving short channel characteristics associated with a halo implant.

What is claimed is:

1. A method for fabricating a semiconductor device comprising:

ion implanting, a semiconductor fin disposed on a substrate, which fin is initially disposed along a Y-axis, extends above the substrate along a Z-axis, and has a gate structure transversing the fin along a X-axis, with ions of a first conductivity type to form spaced-apart tip source and drain regions in the fin along the Y-axis; and ion implanting the semiconductor fin generally under the gate structure, with ions of a second conductivity type to form halo regions generally between the spaced-apart tip source and drain regions, the halo ion implanting occurring with the wafer twisted in the XY plane at a first acute angle, and tilted at a second acute angle in the YZ plane.

2. The method defined by claim 1, wherein the first acute angle is between approximately 10°-45°.

3. The method defined by claim 2, wherein the second acute angle is approximately 50°-55°.

4. The method defined by claim 3, wherein the halo implantation also occurs at the first and second acute angles after the substrate has been twisted approximately 180° so as to implant under the gate structure from the opposite side.

5. The method defined by claim 4, wherein the second acute angle is approximately 50°-55°.

6. The method defined by claim 5, wherein the first acute angle is approximately 10°-45°.

7. The method defined by claim 6, wherein the fin comprises a monocrystalline silicon.

8. The method defined by claim 7, wherein the fin is implanted by the halo ion implantation to a dose of 1E12-1E13 atoms.

9. The method defined by claim 1, wherein the halo ion implantation occurs before the tip ion implantation.

10. A method of fabricating a semiconductor device comprising:

performing one of the following steps before the other:

ion implanting a semiconductor fin disposed on a substrate, which fin is initially disposed on a Y-axis, extends above the substrate on a Z-axis, and has a gate structure transversing the fin on a X-axis, with ions of a first conductivity type to form spaced-apart tip source and drain regions in the fin along the Y-axis, the tip ion implanting occurring with the wafer twisted by approximately 90° and tilted at a first angle in the YZ plane; and ion implanting the semiconductor fin generally under the gate structure, with ions of a second conductivity type to form halo regions, generally between the spaced-apart tip source and drain regions, the halo ion implanting occurring with the wafer twisted in the XY plane at plus and minus a second acute angle, and tilted at a third acute angle in the YZ plane.

11. The method defined by claim 10, wherein the halo implantation also occurs at plus and minus the second acute angle after the substrate has been twisted approximately 180° so as to implant under the gate structure from the opposite side.

12. The method defined by claim 10, wherein the first acute angle is between approximately 50°-55°.

13. The method defined by claim 12, wherein the second acute angle is approximately between 10°-45°.

14. The method defined by claim 13, wherein the third acute angle is approximately between 50°-55°.

15. The method defined by claim 11, wherein the first and third acute angle is approximately between 50°-55° and the second acute angle is approximately between 10°-45°.

16. The method defined by claim 10, including forming spacers on the gate structure before the tip and halo implantations.

17. The method defined by claim 10, including forming spacers between the two implantation steps of claim 10.

18. The method defined by claim 10, wherein the substrate is a bulk silicon substrate.

19. The method defined by claim 10, wherein the substrate is a silicon-on-insulator (SOI) substrate.

* * * * *